United States Patent
Gil

(10) Patent No.: US 7,655,562 B2
(45) Date of Patent: Feb. 2, 2010

(54) METHOD OF MANUFACTURING SEMICONDUCTOR MEMORY DEVICE

(75) Inventor: Min Chul Gil, Busan (KR)

(73) Assignee: Hynix Semiconductor Inc., Icheon-si (KR)

( * ) Notice: Subject to any disclaimer, the term of this patent is extended or adjusted under 35 U.S.C. 154(b) by 339 days.

(21) Appl. No.: 11/800,290

(22) Filed: May 4, 2007

(65) Prior Publication Data

US 2008/0132075 A1    Jun. 5, 2008

(30) Foreign Application Priority Data

Dec. 4, 2006    (KR)   ............... 10-2006-0121490

(51) Int. Cl.
     *H01L 21/4763*    (2006.01)
(52) U.S. Cl. .............. 438/638; 438/622; 438/634; 438/648; 438/740; 438/744; 438/757; 257/E21.029; 257/E21.252; 257/E21.486; 257/E21.577; 257/E21.579
(58) Field of Classification Search ........... 438/622, 438/634, 648, 740, 744, 757, 637; 257/E21.029, 257/E21.252, E21.486, E21.577, E21.579
See application file for complete search history.

(56) References Cited

U.S. PATENT DOCUMENTS 6,037,199 A * 3/2000 Huang et al. ............. 438/166
6,500,357 B1 * 12/2002 Luo et al. ................. 216/79
6,537,923 B1 * 3/2003 Bhatt et al. ............... 438/758

FOREIGN PATENT DOCUMENTS

| KR | 10-2003-0095565 | 12/2003 |
|---|---|---|
| KR | 10-2005-0037712 | 4/2005 |
| KR | 10-2006-0001113 | 1/2006 |

* cited by examiner

Primary Examiner—Long K Tran
(74) Attorney, Agent, or Firm—Marshall, Gerstein & Borun LLP

(57) ABSTRACT

A method of manufacturing a semiconductor device is disclosed. In the method of manufacturing the semiconductor device, a first insulating layer is formed on a semiconductor substrate. A metal line layer and an etch-stop layer are formed over the first insulating layer. The etch-stop layer and the metal line layer are patterned to form a metal line. A second insulating layer is formed on the first insulating layer and the etch-stop layer. A first etch process for etching part of the second insulating layer is performed by using a first etch gas so that the etch-stop layer is exposed. A second etch process for removing the etch-stop layer is performed by using a second etch gas so that the metal line is exposed.

14 Claims, 3 Drawing Sheets

METHOD OF MANUFACTURING SEMICONDUCTOR MEMORY DEVICE

CROSS-REFERENCE TO RELATED APPLICATION

The priority of Korean patent application number 10-2006-121490, filed on Dec. 4, 2006, the disclosure of which is incorporated by reference in its entirety, is claimed.

BACKGROUND OF THE INVENTION

The invention relates, in general, to a method of manufacturing a semiconductor device and, more particularly, to a method of forming a via hole in a semiconductor device.

A semiconductor device includes a plurality of memory cells and transistors, and consists of many elements. Lines connecting the plurality of elements are also extended. As the level of integration in the semiconductor device increases, the width of an individual element and the distance between adjacent elements decreases.

The memory cells are connected by bit lines to form a string structure. The bit lines are formed of metal.

SUMMARY OF THE INVENTION

Accordingly, a method of manufacturing a semiconductor device is disclosed, which method can prevent the loss of a bit line by varying the etch gas used in the process for forming a via hole adjacent to the bit line.

According to an aspect of the invention, there is provided a method of manufacturing a semiconductor device, including the steps of forming a first insulating layer on a semiconductor substrate, forming a metal line layer and an etch-stop layer over the first insulating layer, patterning the etch-stop layer and the metal line layer to form a metal line, forming a second insulating layer on the first insulating layer and the etch-stop layer, performing a first etch process for etching part of the second insulating layer using a first etch gas, thereby exposing the etch-stop layer, and performing a second etch process for removing the etch-stop layer using a second etch gas different from the first etch gas, thereby exposing the metal line.

DETAILED DESCRIPTION OF EMBODIMENTS

Now, a specific embodiment is described with reference to the accompanying drawings.

Figure 1A:
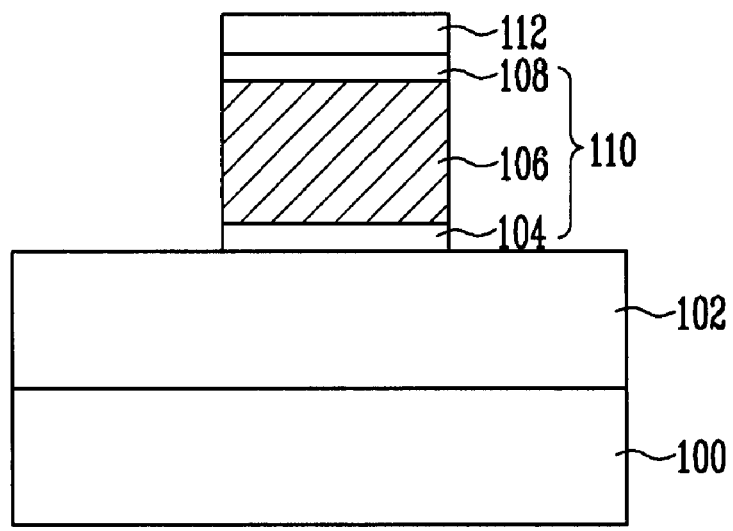
FIGS. 1A to 1E are cross-sectional views illustrating a method of manufacturing a semiconductor device according to the invention.

Referring to FIG. 1A, semiconductor devices (not illustrated), such as transistors or memory cells, are formed over a semiconductor substrate 100. A first insulating layer 102 is formed on the semiconductor substrate 100 including the semiconductor devices. A metal line 110 is formed on the first insulating layer 102. Specifically, after a metal line layer (not illustrated) and an etch-stop layer 112 are formed on the first insulating layer 102, a patterning process is performed. Thus, the metal line 110 is formed and the etch-stop layer 112 remains on the metal line 110.

The metal line 110 can include a stack structure of a first barrier metal layer 104, a metal layer 106 and a second barrier metal layer 108. The first and second barrier metal layers 104, 108 are generally formed of TiN. The metal layer 106 is formed of aluminum (Al) having a low resistivity of 2.5 to 3.2 $\mu\Omega$-cm (at normal temperature). The etch-stop layer 112 can be formed of SiON or nitride, preferably SiON.

Figure 1B:
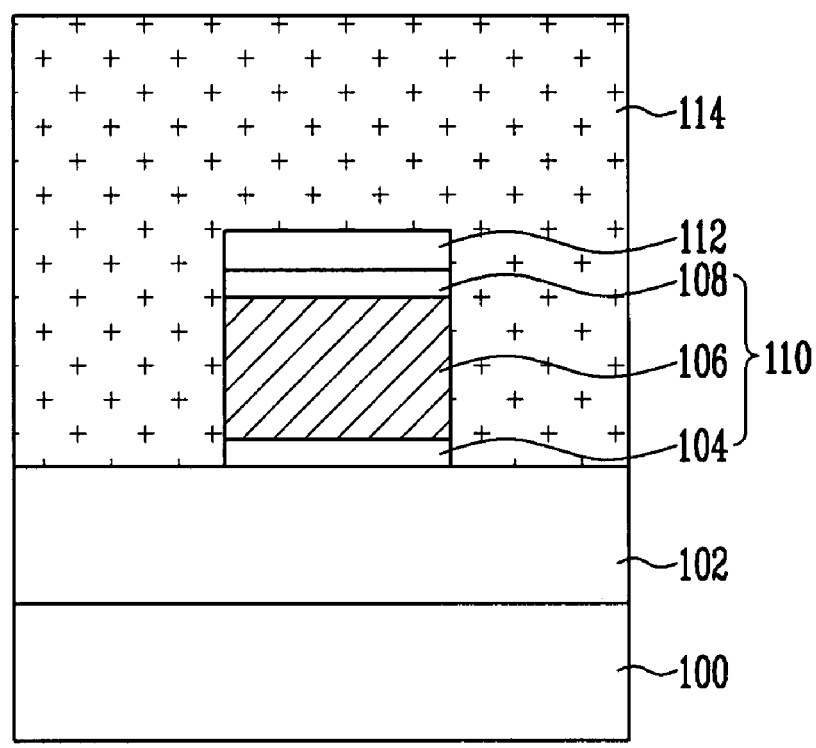

Referring to FIG. 1B, a second insulating layer 114 is formed on the first insulating layer 102 so that the etch-stop layer 112 is completely covered. The first and second insulating layers 102 and are formed of an oxide layer. Though not illustrated in the drawings, the metal layer 106 is connected to a number of other elements.

Figure 1C:
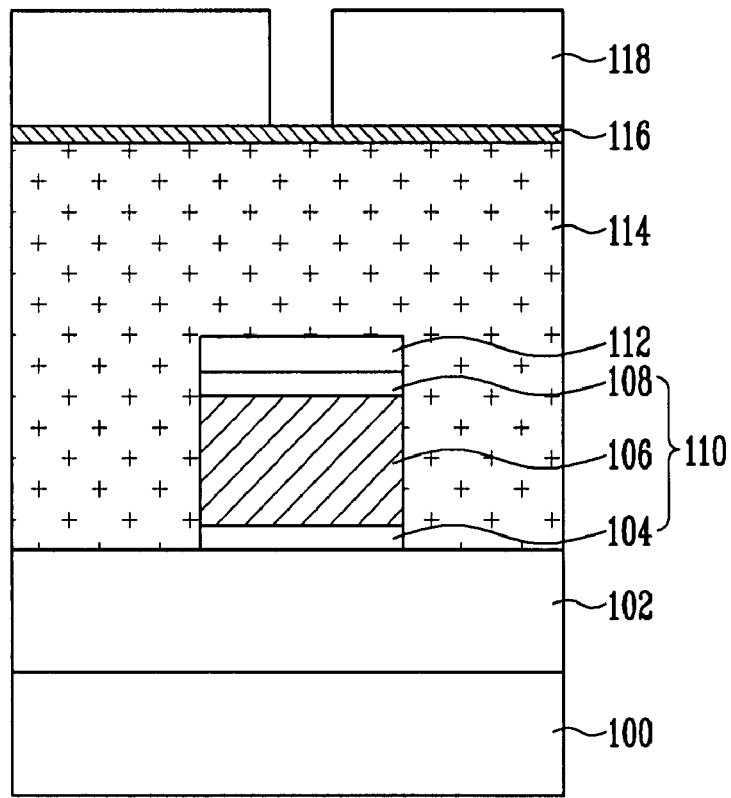

Referring to FIG. 1C, a bottom anti-reflection coating (BARC) layer 116 and a mask layer pattern 118 are formed over the second insulating layer 114. The BARC layer 116 is formed of an organic layer.

Figure 1D:
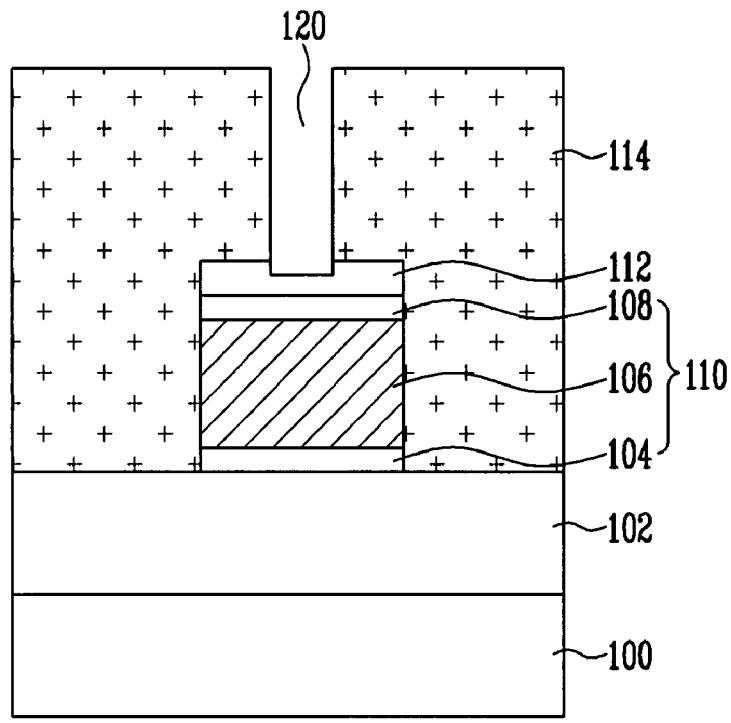

Referring to FIG. 1D, a first etch process is performed in order to remove part of the BARC layer 116 and the second insulating layer 114 according to the mask layer pattern 118. The first etch process forms a via hole 120, and includes removing part of the second insulating layer 114 to form a hole. The etch process is performed up to the etch-stop layer 112. The first etch process generally employs a $C_xH_yF_z$-based gas.

Specifically, the first etch process can be performed using a $C_xH_yF_z$-based mixed gas as a main gas and a mixture of $O_2$, Ar, and CO as an auxiliary gas. In this case, the etch process can remove the etch-stop layer 112 so that the second barrier metal layer 108 can be exposed. After the first etch process is performed, the mask layer pattern 118 and the BARC layer 116 are removed.

Figure 1E:
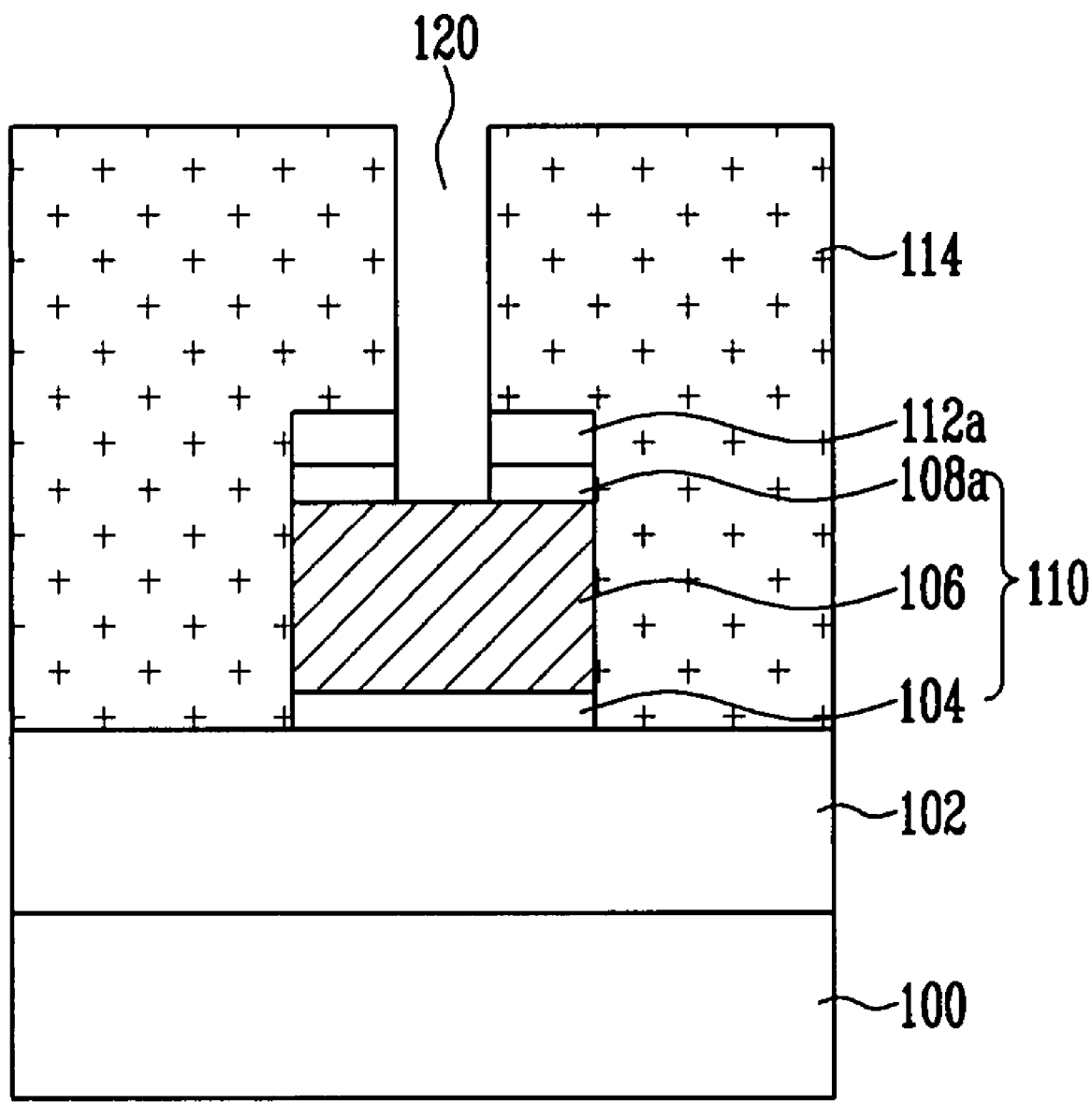

Referring to FIG. 1E, a second etch process is performed to expose the metal layer 106 of the metal line 110. The second etch process exposes the metal layer 106 by removing the exposed portion of the etch-stop layer pattern 112 and the exposed portion of the second barrier metal layer pattern 108 through the via hole 120 using the second insulating layer 114 as a mask. As a result, a residual etch-stop layer pattern 112a and a residual second barrier metal layer pattern 108a remain. The second etch process employs $Cl_2$ and $CHF_3$ as a mixed gas. The ratio of $Cl_2$ to $CHF_3$ can range from 10:1 to 20:1. The mixed gas of $Cl_2$ and $CHF_3$ does not damage to the metal layer 106 for the following reasons.

If aluminum (Al) is etched using $Cl_2$, a reaction product $AlCl_3$ of a chloride base is generated. $AlCl_3$ has a melting point of 170° C. to 190° C., and is a material that can be easily removed. Thus, the etch process can continue without hindering the etching of aluminum (Al). Meanwhile, if the etch process is performed using a $C_xH_yF_z$-based gas containing fluorine (F), both $AlF_3$ and $AlCl_3$ are generated. $AlF_3$ has a very high melting point of 1250° C. to 1290° C. and thus is non-volatile.

As $AlF_3$ is generated, it covers the surface of the metal layer 106 of aluminum (Al). Accordingly, etch damage to the metal layer 106 can be prevented by varying the etch gas even without forming an additional layer for preventing such etch damage.

Further, the first etch process and the second etch process can be performed in-situ or ex-situ.

Accordingly, etch damage to the metal layer 106 can be prohibited when etching the via hole 120.

As described above, the invention has the following advantages.

Aluminum (Al) having a low resistivity can be used as a metal layer.

Etch damage to an aluminum (Al) layer can be prevented when connecting a via hole to an aluminum (Al) bit line.

The size of a device can be easily reduced by changing only an etch gas even without forming an additional layer to compensate for etch loss.

Although the foregoing description has been made with reference to a specific embodiment, it is to be understood that changes and modifications of the disclosure may be made by the skilled artisan without departing from the spirit and scope of the disclosure and appended claims.

What is claimed is:

1. A method of manufacturing a semiconductor device, comprising the steps of:
    forming a first insulating layer on a semiconductor substrate;
    forming a metal line layer and an etch-stop layer over the first insulating layer;
    patterning the etch-stop layer and the metal line layer to form a metal line;
    forming a second insulating layer on the first insulating layer and the etch-stop layer;
    performing a first etch process for etching part of the second insulating layer using a first etch gas, thereby exposing the etch-stop layer;
    performing a second etch process for removing the etch-stop layer using a second etch gas different from the first etch gas, thereby exposing the metal line; and
    covering a surface of metal line with a reaction product that is generated by reacting the exposed metal line and the second etch gas during the second etch process.

2. The method of claim 1, wherein the metal line comprises a first barrier metal layer, a metal layer, and a second barrier metal layer.

3. The method of claim 2, wherein the first and second barrier metal layers comprise TiN.

4. The method of claim 2, wherein the metal layer comprises aluminum (Al).

5. The method of claim 2, wherein the etch-stop layer comprises a SiON layer or a nitride layer.

6. The method of claim 1, wherein the first etch gas comprises a $C_xH_yF_z$-based gas.

7. The method of claim 6, wherein the $C_xH_yF_z$-based gas is a main gas and the first etch gas further comprises a mixture of $O_2$, Ar, and CO as an auxiliary gas.

8. The method of claim 1, wherein the second etch gas comprises $Cl_2$ and $CHF_3$.

9. The method of claim 8, wherein the ratio of $Cl_2$ to $CHF_3$ in the second etch gas is in a range of 10:1 to 20:1.

10. The method of claim 1, comprising performing the first and second etch processes in-situ.

11. The method of claim 1, comprising performing the first and second etch processes ex-situ.

12. The method of claim 1, comprising performing the first etch process in a region of the second insulating layer where a via hole on the metal line is formed.

13. The method of claim 1, wherein the reaction product comprises $AlF_3$.

14. The method of claim 13, wherein the metal line comprises aluminum (Al) and the second etch gas comprises $CHF_3$, the method comprising generating $AlF_3$ by reacting the aluminum (Al) in the metal line and the $CHF_3$ of the second etch gas.

* * * * *